United States Patent [19]

Shearer

[11] 4,339,784
[45] Jul. 13, 1982

[54] SOLDER DRAW PAD

[75] Inventor: James D. Shearer, Indianapolis, Ind.

[73] Assignee: RCA Corporation, New York, N.Y.

[21] Appl. No.: 176,788

[22] Filed: Aug. 11, 1980

[51] Int. Cl.³ .............................................. H05K 3/34
[52] U.S. Cl. .................... 361/403; 174/68.5;
219/85 R; 219/85 M; 228/180 R; 228/260;
228/262
[58] Field of Search .............................. 361/409, 403;
228/180 R, 260, 262; 219/85 F, 85 M, 85 R;
174/68.5

[56] References Cited

U.S. PATENT DOCUMENTS

| | | | |
|---|---|---|---|
| 3,042,740 | 7/1962 | Bosworth | 361/409 X |
| 3,610,811 | 10/1971 | O'Keefe | 361/409 X |
| 3,631,300 | 12/1971 | Humble | 361/409 X |
| 3,824,433 | 7/1974 | Newton | 361/409 X |
| 3,923,359 | 12/1975 | Mewsam | 361/409 X |
| 3,939,381 | 2/1976 | Meany | 361/409 X |
| 4,190,901 | 2/1980 | Johnson | 361/409 X |

OTHER PUBLICATIONS

Ruhl, Roland I., *Electronic Packaging and Production*, "Reducing the Low-Level Incidence of Solder Shorts in Wave Soldering", pp. 82-85, 2/77.

Gegler, Robert H., *The Western Electric Engineer*, "Mass Soldering of High-Density Circuit Packs", pp. 38-42 (Oct. 1979).

*Primary Examiner*—Richard R. Kucia
*Attorney, Agent, or Firm*—E. M. Whitacre; J. S. Tripoli; J.E. Roehling

[57] ABSTRACT

Soldering techniques, where a circuit component having a row of closely spaced leads (e.g., dual in-line packages) are to be soldered to a printed circuit board and the leads are oriented on the printed circuit board such that the row of leads is arranged parallel to the direction of motion of the printed circuit board through a wave solder pot, may effect a high incidence of soldering bridging. This bridging may form between the last few adjacent leads in the row which emerges from the solder pot. A printed circuit board is provided with an additional foil pad (or a pair of additional pads in the case of a dual in-line package) arranged in line with the row of leads. This additional foil pad tends to draw off any excess solder to reduce the solder bridging between adjacent leads during the soldering operation.

6 Claims, 3 Drawing Figures

SOLDER DRAW PAD

This invention relates generally to printed circuit boards for electronic instruments and, more specifically, to printed circuit boards having solder pad arrangements which reduce solder bridging between adjacent leads of components inserted into the boards.

Printed circuit board structures, such as those commonly used in electronic instruments, are often soldered by automated techniques such as wave soldering. Solder bridging between adjacent component terminals, particularly with respect to dual in-line packages, may represent a substantial number of defects in the soldering operation. In the prior art it has been found that small changes in pad geometry, size, orientation and component lead length can reduce the number of solder bridges in an automated soldering system.

Some components and lead arrangements present difficult problems in mass soldering. The nature of the lead arrangement, component size, and solder may possibly enhance the formation of solder defects such as solder bridges. It has been found that if certain components which have a row of closely spaced leads (e.g., dual in-line packages) are arranged on a printed circuit board such that the row of leads is parallel to the direction which the printed circuit board is driven through the solder wave of a mass soldering system the incidence of solder bridging between the last two leads to emerge from the solder wave is generally higher than the incidence of solder bridges between adjacent leads of components which are turned such that the row of leads is perpendicular to the direction of motion.

It is felt that this higher incidence of solder bridging for parallel leads may be explained with reference to the nature of the soldering technique. As a component having a dense lead pattern emerges from the solder wave, a web of solder forms which fills the space between adjacent leads. The surface tension of the solder is such that when the web of solder breaks, an icicle of solder may form between the last two adjacent leads in each row of, for example, a dual in-line package which emerges from the solder wave thus causing a solder bridge.

In accordance with the principles of the present invention, dummy metallic draw pads are arranged on the printed circuit board in conjunction with any circuit component having a row of leads to draw off any excess solder and help eliminate solder bridges between adjacent pins during the soldering operation.

In further accordance with the principles of the present invention, a printed circuit board structure is provided. A portion of the printed circuit board material is provided with a plurality of apertures which are aligned in a straight row. A plurality of metallic pads are located on a surface of the printed circuit board material and aligned in a straight row such that each of the metallic pads is arranged to encircle one of the plurality of apertures. A circuit component element including a body and a row of a plurality of exposed leads is provided on the printed circuit board material, the circuit component element being attached to the piece of printed circuit board material by inserting the plurality of exposed leads into the plurality of apertures and soldering the inserted leads to the metallic pads which encircle the plurality of apertures. The structure further includes an additional metallic pad located on the surface of the printed circuit board material. This additional pad is arranged in alignment with the plurality of metalic pads and adjacent to one of the plurality of metalic pads such that solder bridging between adjacent leads is reduced.

Other features and advantages of the invention will be more fully understood from the following detailed description of the preferred embodiment, the appended claims, and the accompanying drawings in which:

Figure 1:
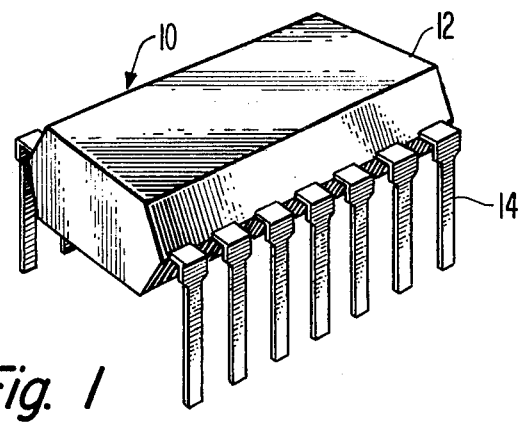
FIG. 1 is a perspective view of a semi-conductor integrated circuit.

Referring to FIG. 1, a packaged semi-conductor such as a dual in-line package designated generally as 10 and having exposed lead 14 extending into a carrier 12 is shown. The carrier 12 may be any one of a wide variety of thermo setting plastic materials or ceramic materials. The exposed leads may be formed of Kovar or mild steel having a thickness of approximately 0.01 inch.

Figure 2:
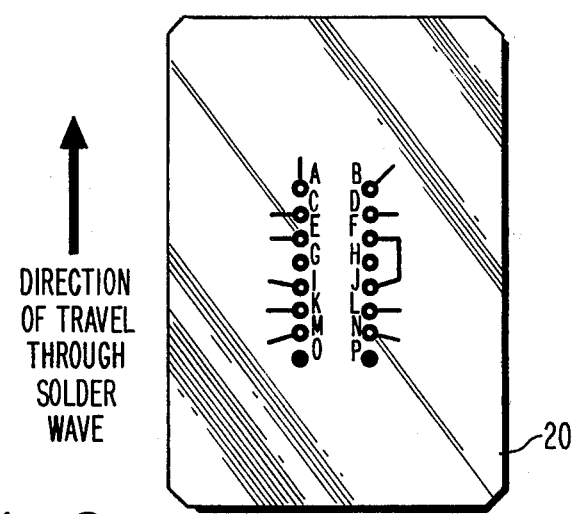
FIG. 2 illustrates a printed circuit board constructed in accordance with the principles of the present invention.

Referring to FIG. 2, a printed circuit board 20 is illustrated. The board material is fiberglass or some other non-conductive material. A pattern of metal foil conductors A through P is photographically etched from or added to the board surface. In the embodiment shown in this application, the printed circuit board is a single-clad board (i.e., with foil conductors on only one side), although the present invention is equally applicable to double-clade boards.

Holes are drilled or punched through the printed circuit board 20 in the center of foil pads A through N. These holes formed in foil pads A through N accommodate the exposed leads 14 of packaged semi-conductor 10 which is shown in FIG. 1. Foil pads O and P which are formed in line with foil pads A through N and equally spaced on centers are positioned on printed circuit board 20 to follow each row of metallic pads through a wave solder pot during the soldering operation. Foil pads O and P which act as the solder draw pads are not used for connections on the board, they are dummies. Of course, the number of leads 14 of packaged semi-conductor 10 may be greater or less than the fourteen illustrated. Correspondingly the number of foil pads with holes on printed circuit board 20 will vary to match the number of leads.

Figure 3:
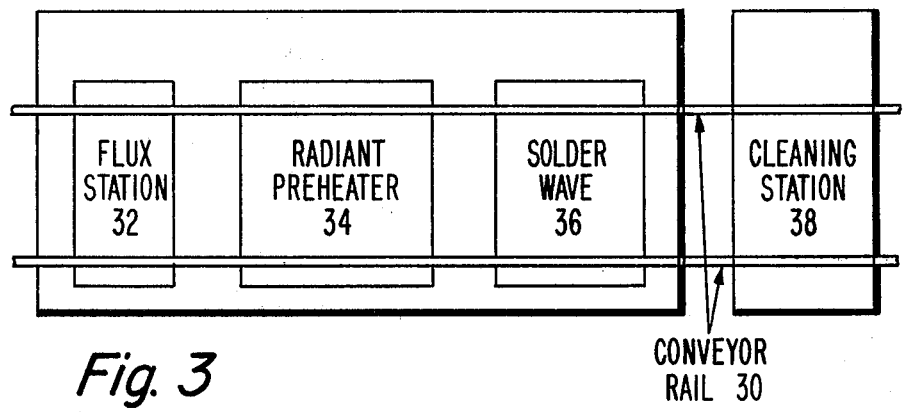
FIG. 3 is a diagram of the components of a wave-soldering system.

FIG. 3 diagrammatically represents a wave-soldering system. Conveyor rails 30 provide means for conveying a printed circuit board of the type illustrated in FIG. 2 over the various components of the mass soldering system. At flux station 32, a uniform coating of flux is applied to the bottom of the printed circuit board. The flux prepares the circuit pack for soldering. Radiant heater 34 evaporates the solvents applied during the fluxing operation and preheats the board prior to its introduction into the wave solder station. At wave solder station 36, the individual component leads are soldered to the metallic pads on the printed circuit board. An optional cleaning station 38 removes continents which may degrade the components or printed circuit board.

In operation, the printed circuit board having components inserted is arranged on conveyor rails 30 such that dummy pads O and P follow the two rows of metallic pads as shown in FIG. 2. These dummy pads O and P, positioned to trail the pad pattern through the solder wave of solder wave station 36, provides a draw pad action for collecting excess solder without creating a short. In the absence of draw pads O and P, it has been found that solder bridges often occur between pads such as K and M or L and N (or both) as the printed circuit board exits the solder wave station.

Printed circuit boards including the draw pads constructed in accordance with the present invention have been built. A dramatic reduction in solder joint failures after the pad was added have been observed in almost every case. By selecting the proper configuration for the dummy solder pads, wave soldering failures, as defined by solder bridges, may be significantly reduced.

While the principles of the present invention have been demonstrated with particular regard to the illustrative structures of the FIGURES, it will be recognized that various departures from such illustrative structures may be undertaken in practice of the invention. For example, the printed circuit board as shown in FIG. 2 could be oriented to pass through the solder wave orthogonal to the direction shown on that FIGURE. It should be noted that a reduction in solder bridges has been realized for this orientation.

What is claimed is:

1. A printed circuit board structure comprising:
   a piece of printed circuit board material;
   a plurality of metallic pads located on a surface of said printed circuit board material and aligned in a straight row, each of said plurality of metallic pads having an aperture formed therein;
   a circuit component element including a body and a plurality of leads formed in a straight row, each of said plurality of leads being inserted in respective ones of said plurality of apertures formed in said metallic pads, said circuit component element being attached to said piece of printed circuit board material by soldering said inserted leads to said metallic pads as said piece of printed circuit board material flows across a wave of solder;
   said straight row of leads having first and second ends, and being inserted in said piece of printed circuit board material such that said straight row of leads is parallel to the direction that said piece of printed circuit board material travels through said wave of solder, said circuit component element being positioned on said piece of printed circuit board material such that said first end of said row of leads enters said wave of solder prior to said second end of said row; and
   an additional metallic pad located on said surface of said printed circuit board material, said additional pad being arranged in alignment with said plurality of metallic pads and adjacent to one of said plurality of metallic pads such that said additional metallic pad provides a draw pad action for reducing solder bridging between adjacent leads located at said second end of said row of leads; said additional metallic pad not providing an attachment point for soldering leads of said circuit component elements or additional circuit component elements.

2. The printed circuit board structure according to claim 1 wherein said circuit component element further includes a second plurality of leads formed in a straight row and further comprising:
   a second plurality of metallic pads located on said surface of said printed circuit board material and aligned in a straight row;
   each of said second plurality of metallic pads having an aperture formed therein;
   a second additional metallic pad located on a surface of said printed circuit board material, said second additional pad being arranged in alignment with said straight row of said second plurality of metallic pads and adjacent to one of said second plurality of metallic pads; said second additional metallic pad not providing an attachment point for soldering leads of circuit component elements.

3. The printed circuit board structure according to claim 4 wherein said straight row of said plurality of metallic pads is parallel to said straight row of said second plurality of metallic pads.

4. The printed circuit board structure according to claim 5 wherein said circuit component element comprises a dual in-line semiconductor package.

5. The printed circuit board structure according to claim 6 wherein said circuit component element is arranged on said printed circuit board material such that said straight row of said plurality of metallic pads is parallel to the direction which said printed circuit board material is linearly driven across said wave of solder, said wave of solder contacting all of said metallic pads on said printed circuit board.

6. The printed circuit board structure according to claim 7 wherein said additional metallic pad and said second additional metallic pad are arranged on said printed circuit board material to follow said straight row of said plurality of metallic pads and said straight row of said second plurality of metallic pads respectively across said wave of solder.

* * * * *

UNITED STATES PATENT AND TRADEMARK OFFICE
CERTIFICATE OF CORRECTION

PATENT NO. : 4,339,784
DATED : July 13, 1982
INVENTOR(S) : James D. Shearer

It is certified that error appears in the above-identified patent and that said Letters Patent is hereby corrected as shown below:

Column 2, line 31, " double-clade " should be -- double-clad --.
Column 2, line 68, " provides " should be -- provide --.
Column 4, line 28, " 4 " should be -- 2 --.
Column 4, line 33, " 5 " should be -- 3 --.
Column 4, line 37, " 6 " should be -- 4 --.
Column 4, line 44, " 7 " should be -- 5 --.

Signed and Sealed this

Fifth Day of October 1982

[SEAL]

Attest:

GERALD J. MOSSINGHOFF

*Attesting Officer*     *Commissioner of Patents and Trademarks*